US006380624B1

(12) United States Patent
Hung

(10) Patent No.: US 6,380,624 B1
(45) Date of Patent: Apr. 30, 2002

(54) STACKED INTEGRATED CIRCUIT STRUCTURE

(75) Inventor: Chia-Yu Hung, Kaohsiung (TW)

(73) Assignee: Walsin Advanced Electronics Ltd., Kachsiung (TW)

( * ) Notice: Subject to any disclaimer, the term of this patent is extended or adjusted under 35 U.S.C. 154(b) by 0 days.

(21) Appl. No.: 09/685,422

(22) Filed: Oct. 10, 2000

(51) Int. Cl.$^7$ ............................................. H01L 23/34
(52) U.S. Cl. ...................... 257/723; 257/685; 257/686
(58) Field of Search ................................ 257/685, 723, 257/686; 438/107, 109

(56) References Cited

U.S. PATENT DOCUMENTS

| 6,013,948 A | * | 1/2000 | Akram et al. ............... 257/698 |
| 6,020,629 A | * | 2/2000 | Farnworth et al. .......... 257/686 |
| 6,291,892 B1 | * | 9/2001 | Yamaguchi ................. 257/778 |

* cited by examiner

Primary Examiner—Richard Elms
Assistant Examiner—Christian D. Wilson
(74) Attorney, Agent, or Firm—J. C. Patents

(57) ABSTRACT

A stacked integrated circuit structure, in which main package bodies of a plurality of integrated circuits are stacked on each other. Connections between leads of the stacked integrated circuits are made by means of a stacking substrate. Therein, each of two surfaces of the stacking substrate has a plurality of terminals electrically connected to corresponding terminals. The stacking substrate includes a plurality of through vias as well, which connect to the corresponding terminals of the two surfaces. For two stacked integrated circuits, a hole can be defined in the stacking substrate, which housed the main package body of one of the two stacked integrated circuits, or by means of a plurality of separated substrates arranged around the perimeter of the main package body of one of the two stacked integrated circuits, so that the thickness of the stacked integrated circuits can be reduced.

17 Claims, 5 Drawing Sheets

STACKED INTEGRATED CIRCUIT STRUCTURE

BACKGROUND OF THE INVENTION

1. Field of the Invention

The present invention relates to a stacked integrated circuit stacked structure. More particularly, the present invention relates to a stacked integrated circuit structure in which a substrate is employed as a stacking medium between the leads of the stacked integrated circuits.

2. Description of the Prior Art

In this information-centered world, integrated circuits are closely related to daily living. Commodities composed of integrated circuits are currently in use in all aspects of living. As electronic technique improves, electronic products having more powerful functions and that are more humanized are being manufactured. They all have the same design goal of being lightweight and small in size in order to provide comfortable usage. The mass production of 0.18 microns integrated circuits is currently achieved, and many other micro-packaging structures, for example, the chip scale package (CSP), the wafer level package, the multichip module (MCM), etc. have been developed successfully. In addition, the assembly technique for electronic elements also includes the high-density multi-level PCB, which allows IC packages to be arranged closer together on the PCB.

Therefore, stacked packaging structures are currently in development. By means of the packaging structure design, packaged ICs can be stacked on top of each other in a three-dimensional structure. A prior art stacked packaging structure is schematically shown in FIG. 1. Semiconductor dice 100$a$, 100$b$ are connected to leadframes 104$a$, 104$b$ by means of bonding wires 102, and enveloped by a molding compound 106, for example, epoxy, to form individual packages 108$a$, 108$b$, respectively. Differences in bending of outer leads of the leadframes 104$a$, 104$b$ are employed to establish a three-dimensional stacked structure for the packages 108$a$, 108$b$ as shown in FIG. 1.

Because direct connections between the leads are used in the stacked structure of prior art, the assembly process is not easy to control, Electrical shorts between the leads may occur due to deformations of the leads caused by external forces, especially for those products having high leads positions and small leads separations. Moreover, additional apparatus are required for the assembly of the prior art stacked structure for mass production.

SUMMARY OF THE INVENTION

Accordingly, one object of the present invention is to provide a stacked integrated circuit structure, which employs a substrate as a stacking medium between leads of stacked integrated circuits, whereby increasing the tightness of leads connections.

The second object of the present invention is to provide a stacked integrated circuit structure which does not require additional apparatus for mass production.

The third object of the present invention is to provide a stacked integrated circuit structure which is applicable to the memory module. Thus, the memory size can be increased but not the overall area. Hence, the assembly density is increased.

The fourth object of the present invention is to provide a stacked integrated circuit structure which makes the production and the assembly of the memory module easier.

The fifth object of the present invention is to provide a stacked integrated circuit structure, in which circuitry and electronic elements of the memory module can be directly mounted on the substrate used for stacking. Thus, the goal of manufacturing process integration can be accomplished.

To achieve these objects and other advantages and in accordance with the purpose of the present invention, a stacked integrated circuit structure is described herein. A plurality of main package bodies of a plurality of integrated circuits are stacked on each other, with a stacking substrate aligned between leads of the stacked integrated circuits for connection means. Therein, each of two surfaces of the stacking substrate includes a plurality of terminals electrically connected to the corresponding leads. The stacking substrate also contains a plurality of through vias connecting the corresponding terminals on the two surfaces. For two integrated circuits stacked on each other, a hole can be defined in the stacking substrate to house a main package body of one of the integrated circuits, or by means of individually separated substrates arranged around a perimeter of a main package body of one of the integrated circuits, so that the thickness of the stacked integrated circuits is reduced.

While employing the stacked integrated circuit structure of the present invention to a memory module, a plurality of holes is defined on a substrate. A plurality of terminals is located on two surfaces of the substrate as well. A main package body of an integrated circuit is housed in each of the holes, with leads of the integrated circuit electrically connected to the terminals on a first surface of the substrate. An integrated circuit is stacked on a second surface corresponding to each of the hole positions, with leads connected to the corresponding terminals. In addition, a plurality of recesses is located on the first surface. A module circuit board includes traces, electronic elements, and golden fingers, which are electrically connected to each other. During the assembly process, the first surface of the stacking substrate faces the module circuit board for connections, with the electronic elements received in the recesses, and the terminals on the first surface electrically connected to the traces.

Another application to a memory module is the direct fabrication of traces on a substrate, with electronic elements directly inserted into the substrate and electrically connected to the traces. Connecting the whole stacked structure to a circuit board with golden fingers then forms a memory module.

BRIEF DESCRIPTION OF THE DRAWINGS

The accompanying drawings are included to provide a further understanding of the present invention, and are incorporated in and constitute a part of this specification. The drawings illustrate preferred embodiments of the present invention and, together with the description, serve to explain the principles of the present invention. In the drawings.

DESCRIPTION OF THE PREFERRED EMBODIMENTS

Figure 1:
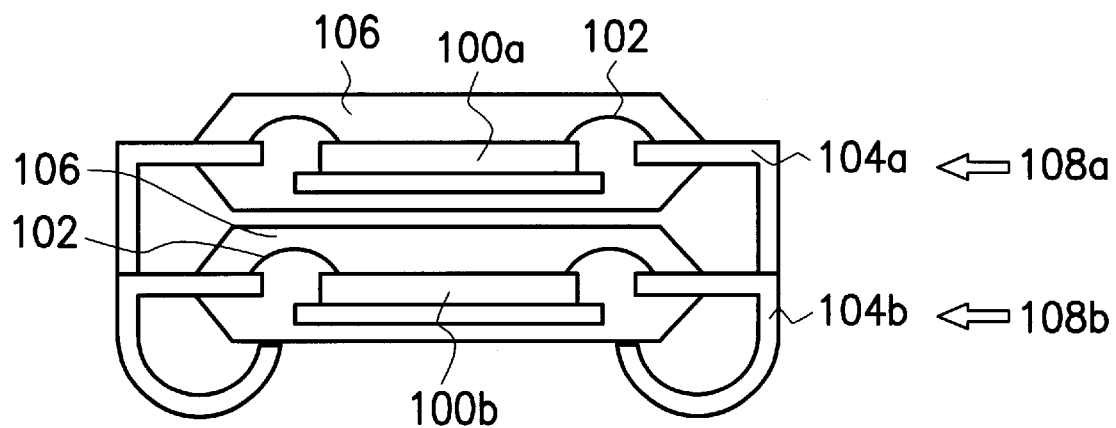
FIG. 1 is a perspective view of a prior art stacked packaging structure.
Figure 2:
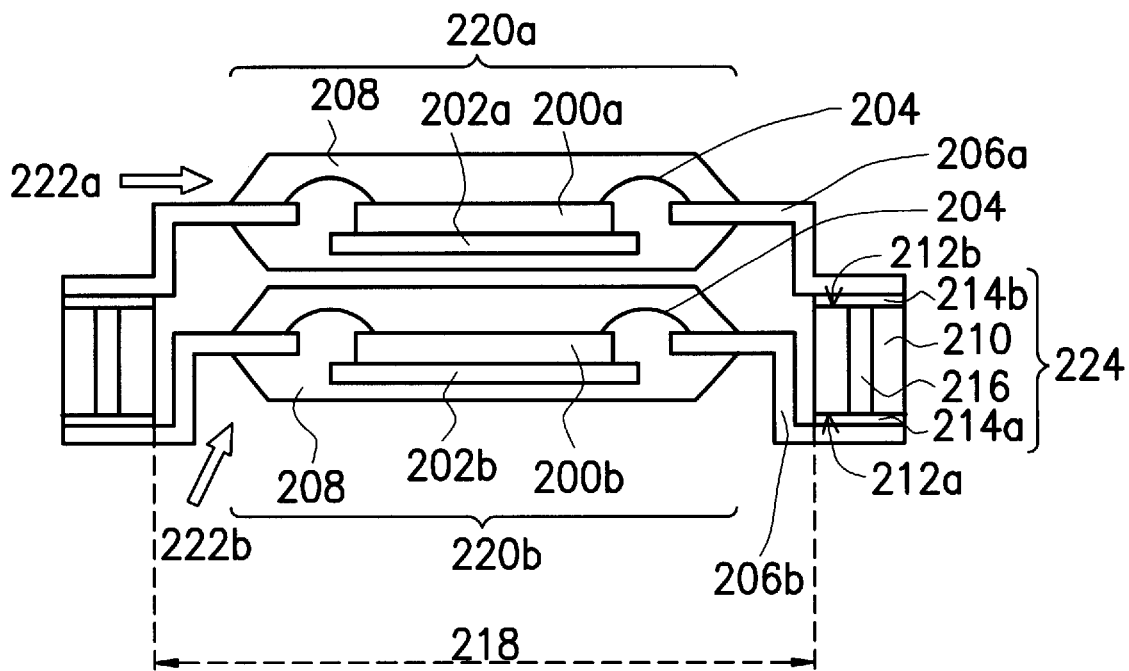
FIG. 2 is a schematic, cross-sectional view of a stacked integrated circuit structure in accordance with a preferred embodiment of the present invention.

Reference is made to FIG. 2, which illustrates a schematic, cross-sectional view of a stacked integrated circuit structure in accordance with a preferred embodiment of the present invention. Integrated circuits 222a, 222b are stacked on each other as shown in FIG. 2. The integrated circuits 222a, 222b consist of dice 200a, 200b mounted on die pads 202a, 202b by means of conductive adhesives or insulating adhesives, respectively. Bonding pads of the dice 200a, 200b are connected to inner portions of leads 206a, 206b of leadframes, respectively, through gold, aluminum or copper bonding wires 204. A molding compound 208 of, for example, an epoxy, is then employed to envelope the dice 200a, 200b, the die pads 202a, 202b, the bonding wires 204, and the inner portions of the leads 206a, 202b to form individual integrated circuits 222a, 222b, respectively.

Outer portions of the leads 206a, 202b are bent in a gull wing-type shape. Electrical connections between the leads 206a and 202b of the integrated circuits 222a and 222b, respectively, are established through a substrate 224. The substrate 224 consists of an insulating core layer 210, a conductive via 216 in the insulating core layer 210, and terminals 214a, 214b. Materials of the insulating core layer 210 include FR-4, FR-5, BT, etc. The conductive via 216 is fabricated by drilling and then filling with conductive filling materials, or electroplating a peripheral sidewall of the conductive via 216 with copper and then filling with insulating filling materials. The terminals 214a, 214b, usually made of copper are located on a first surface and a second surface of the substrate 224, respectively. Connections between the terminals 214a, 214b and the leads 206a, 202b are made by means of solder. Through the conductive via 216 the terminal 214a and the terminal 214b are electrically connected.

Furthermore, a thickness of the substrate 224 is designed to be almost the same as a thickness of a main package body 220b (that is, a molding portion) of the integrated circuit 222b, which is about 1.0–1.5 mm. Thus, the main package body 220b of the integrated circuit 222b is housed in a space 218 between the substrates 224. For a small outline package (SOP) the leads are only located at two parallel lateral edges of the package, and hence, the substrates 224 are two individual substrates, separately located adjacent to two lateral edges of the integrated circuit 222b with the leads 202b. For a quad flat package (QFP), in which the leads are located on all four sides of the package, the substrate 224 is a substrate with a hole (that is, the space 218). This allows the main package body 220b of the integrated circuit 222b to be housed inside the hole 218. The lead 202b of the integrated circuit 222b is connected to the terminal 214a on the first surface 212a of the substrate 224. The main package body 220a of the integrated circuit 222a is stacked on the main package body 220b of the integrated circuit 222b, with the lead 206a connected to the terminal 214b on the second surface 212b of the substrate 224. In addition, the integrated circuit packages described above are packaging structures with the die pads. However, those skilled in the art will appreciate that LOC, COL, etc. structures can also be employed.

Figure 3:
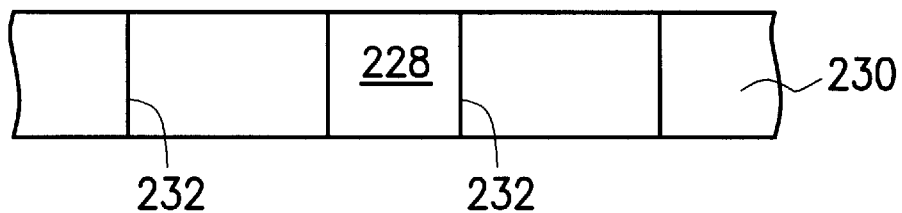
FIGS. 3 to 7 are cross-sectional views showing method steps for manufacturing the stacked integrated circuit structure in accordance with the present invention.

References are made to FIGS. 3 to 7, which are cross-sectional views showing method steps for manufacturing the stacked integrated circuit structure in accordance with the present invention. FIG. 3 illustrates a substrate 228 with its core formed mainly of an insulating core layer 230 of FR-4, FR-5, BT, etc. Its thickness is about the same as a thickness of an integrated circuit, that is, about 1.0–1.5 mm. Holes 232 are fabricated by the punching technique.

Figure 4:
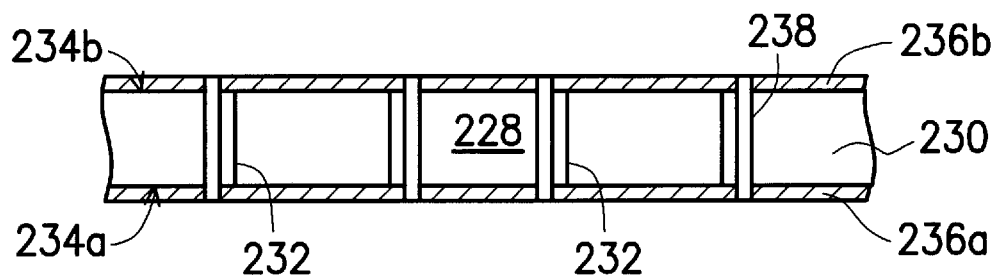

Reference is made to FIG. 4, in which copper films 236a, 236b are pressed on a first surface 234a and a second surface 234b of the insulating core layer 230, respectively. A plurality of through vias 238 is fabricated in the substrate 228 by a drilling process. The vias 238 extend through the copper films 236a, 236b and the insulating core 230.

Figure 5:
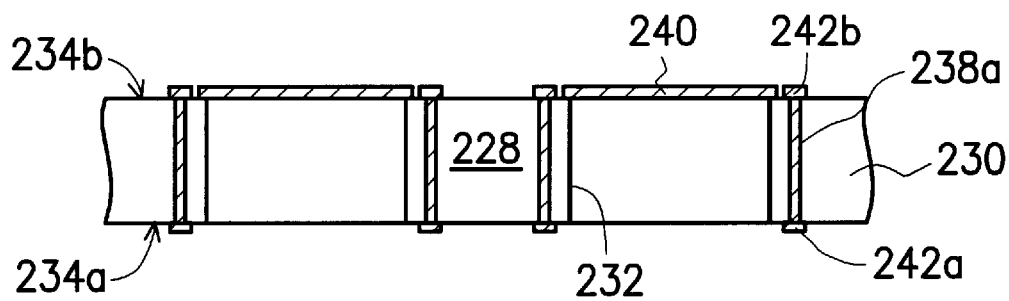

Reference is made to FIG. 5, in which a filling process is performed to produce a conductive via 238a. Two different procedures are available. (1) A peripheral sidewall of the through via 238 is electroplated with copper, and then filled with insulating materials. (2) The through via 238 is filled with a conductive material of, for example, a silver adhesive. The copper films 236a, 236b are then defined by means of photolithographic and etching techniques, and parts of the copper films are removed to form a copper film 240 and terminals 242a, 242b. The copper film 240 is located on the second surface 234b corresponding to the hole 232. It can be a cover covering the whole hole 232, in strip form crossing over the hole 232, or crossed or perpendicularly overlapped over the hole 232, etc. Electrical connections between terminals 242a and 242b are established through the conductive via 238a. A solder mask is then deposited with the terminals 242a, 242b exposed. Gold layers are electroplated on surfaces of the terminals 242a, 242b. Tin is spread on the terminal 242a on the first surface 234a, which is used later for leads connections.

Figure 6:
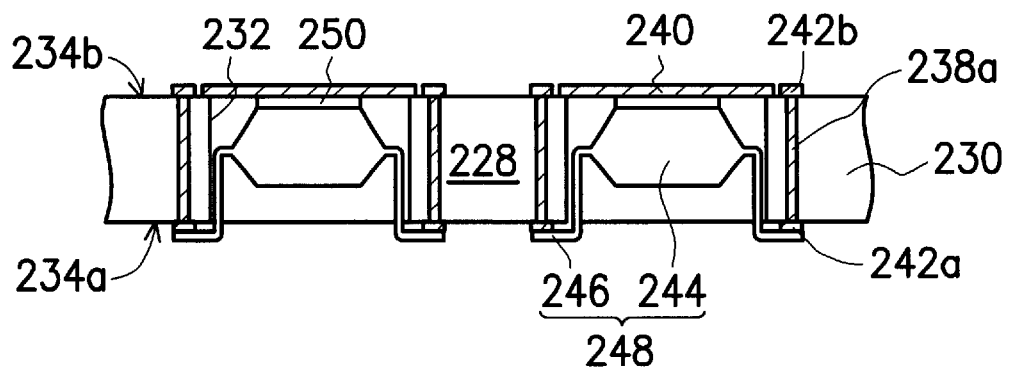

Reference is made to FIG. 6, in which an integrated circuit 248 is housed inside the hole 232 through the first surface 234a. A main package body 244 of the integrated circuit 248 is secured on the copper film 240 by an adhesive 250. Leads 246 of the integrated circuit 248 are connected to the corresponding terminals 242a on the first surface 234a located around a periphery of the hole 232. As the thickness of the substrate 228 is almost the same as the thickness of the main package body 244, the main package body 244 can be completely housed inside the hole 232.

Figure 7:
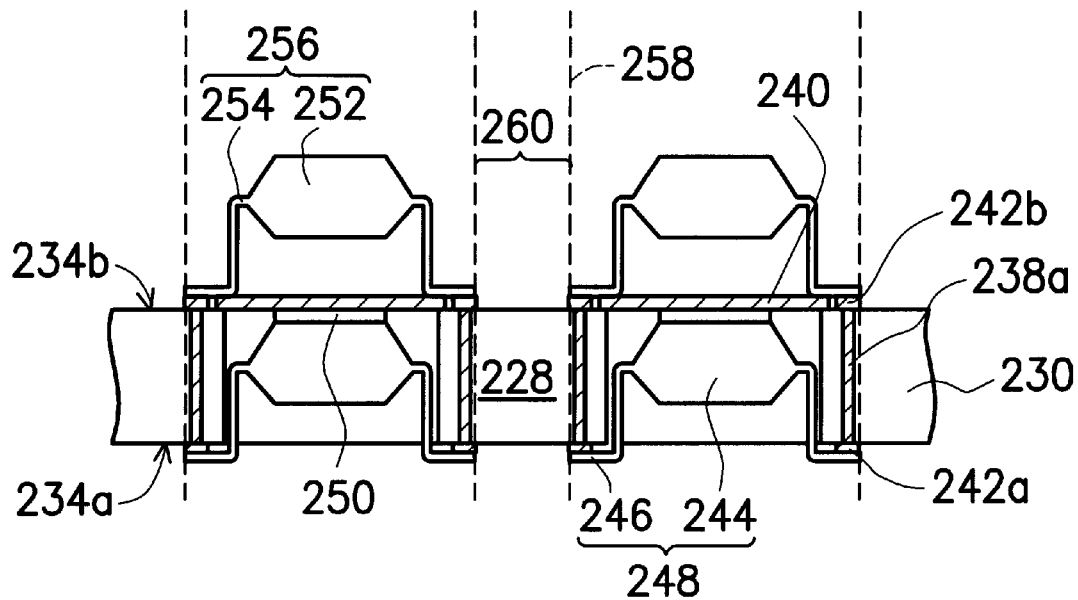

Reference is made to FIG. 7, in which another integrated circuit 256 is stacked on the integrated circuit 248. The integrated circuit 256 is mounted on the second surface 234b of the substrate 228. A main package body 252 of the integrated circuit 256 is positioned almost on top of the main package body 244 of the integrated circuit 248. Before affixation of the integrated circuit 256, a solder paste can be deposited on the terminals 242b, which is used for connections between leads 254 of the integrated circuit 256 and the terminals 242b. The substrate 228 together with the integrated circuits 248, 256 is then put into an oven for heating. Heating can be provided by either hot air or an infra red light. Thus, solders on the terminals 242a, 242b are melted and fused, which ensures good connections between the terminals 242a, 242b and the leads 246, 254, respectively. At this moment, a stacked structure of the integrated circuits 248, 256 is fabricated. Here, each stacked structure is defined as the structure formed of one integrated circuit 248 and one integrated circuit 256. Later, individual stacked structures can be separated along cutting lines 258 according to customer requirement. This gives a structure similar to the one shown in FIG. 2. Or by considering the later assembly process that followed, suitable spacings 260 are determined during the design period. A group of stacked structures can be cut as a single unit according to customer requirement. The whole unit is then employed directly in the assembly process that follows.

Figure 8:
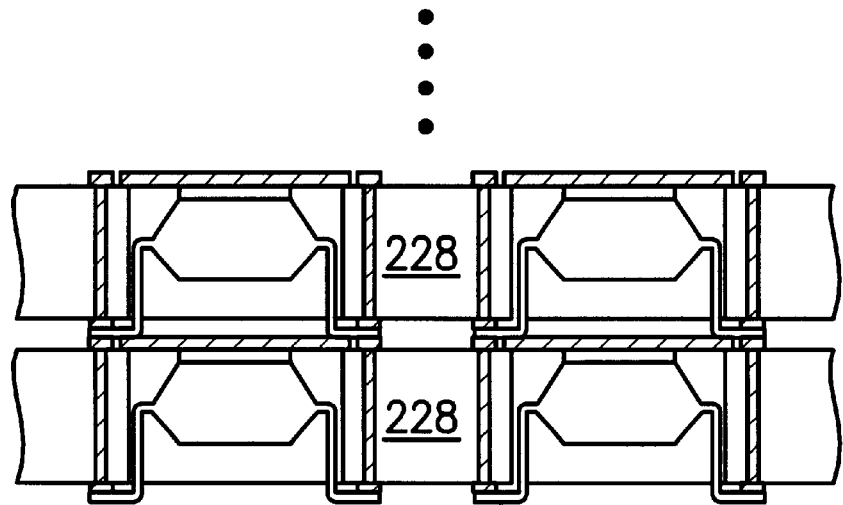
FIG. 8 illustrates a multi-level stacked integrated circuit structure.

Reference is made to FIG. 8. Although two integrated circuits are stacked on each other as an example of a stacked n integrated circuit structure as described above, the method described can also be employed to stack multiple integrated circuits as shown in FIG. 8. The feature is that connections between the leads of every two stacked integrated circuits are by means of a substrate. Moreover, the integrated circuits are housed inside the substrates so that the overall thickness of the stacked structure is not increased. As connections between the substrates and the leads of the integrated circuits are formed by means of a technique similar to SMT technique, the yield and the reliability of the products are relatively high and assembly is easy.

Figure 9A:
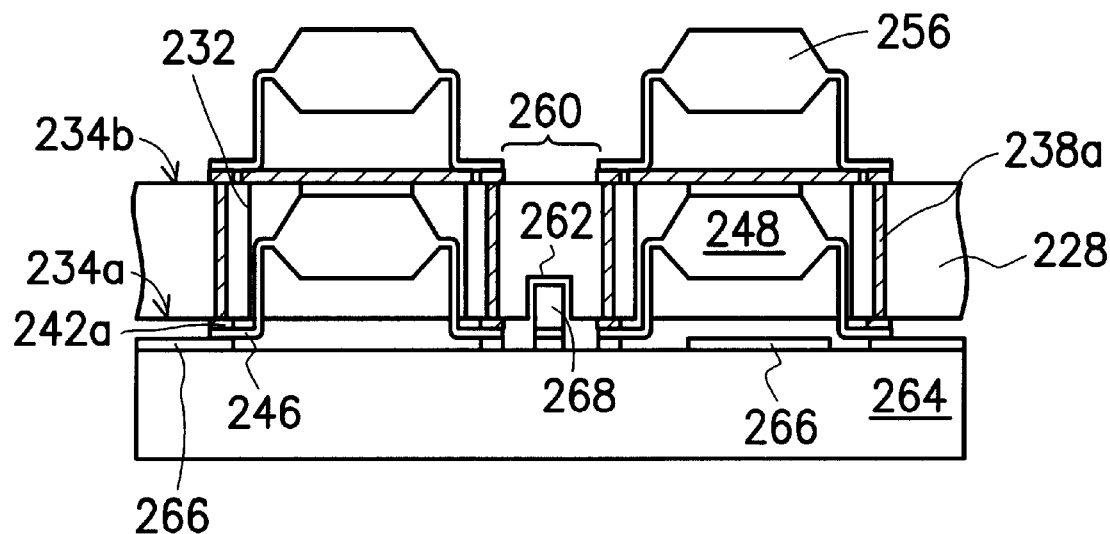
FIG. 9A is a schematic, cross-sectional view of a memory module in which the stacked integrated circuit structure is employed in accordance with an embodiment of the presented invention.
Figure 9B:
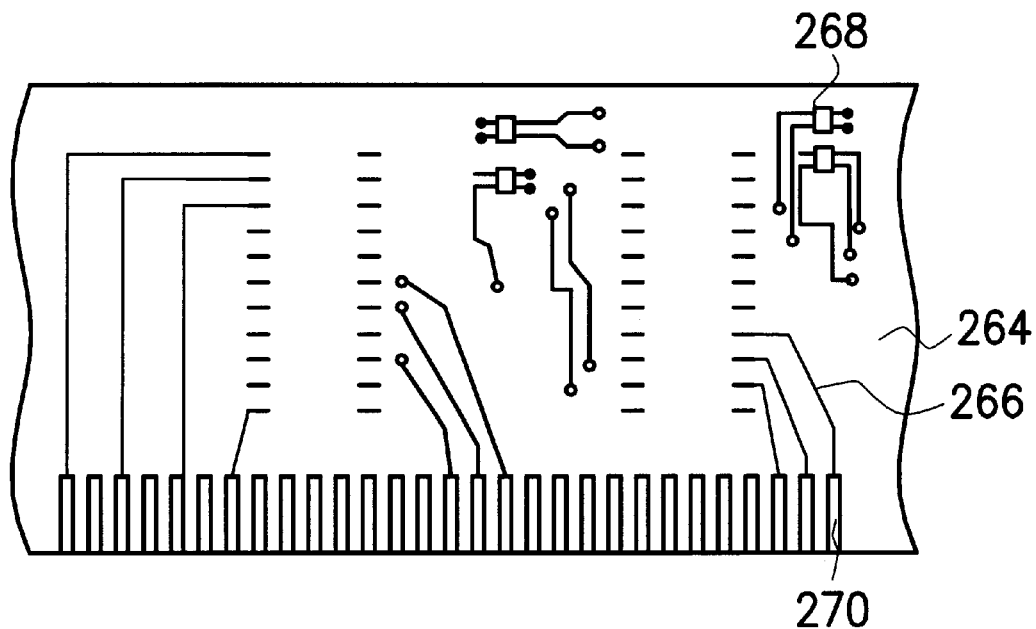
FIG. 9B is a top view of a module circuit board which matches the module illustrated in FIG. 9A.

The stacked integrated circuit structure according to the present invention is very suitable for memory module application. Memory size can be increased without increasing overall area. Reference is made to FIGS. 9A and 9B. FIG. 9A illustrates a schematic, cross-sectional view of a memory module in which the stacked integrated circuit structure is employed in accordance with an embodiment of the present invention, and FIG. 9B is a top view of a module circuit board which matches the module illustrated in FIG. 9A. In the memory module, besides the memory chip itself, are also included many electronic elements such as redundancy chips, which are used for CRC check, error check, parity check, etc. of the memory. Therefore, besides having to determine the spacings 260 between the holes 232 for a memory module application, as in the stacked integrated circuit structure shown in FIG. 7, a plurality of recesses 262 need to be formed on the first surface 234a of the substrate 228. As shown in FIG. 9B, a module circuit board 264 includes traces 266 fabricated on it, electronic elements 268 electrically connected to each other, and golden fingers 270 located at an edge of the module circuit board 264 and electrically connected to the traces 266. During the assembly process, the substrate 228 together with the integrated circuits 248, 256 are mounted on the module circuit board 264 with the first surface 234a facing to it. By employing the SMT technique, electrical connections among the terminals 242a on the first surface 234a of the substrate 228, the leads 246, and the traces 266 on the module circuit board 264 are established. In this instance, the electronic elements 268 on the module circuit board 264 are received inside the recesses 262.

Figure 10A:
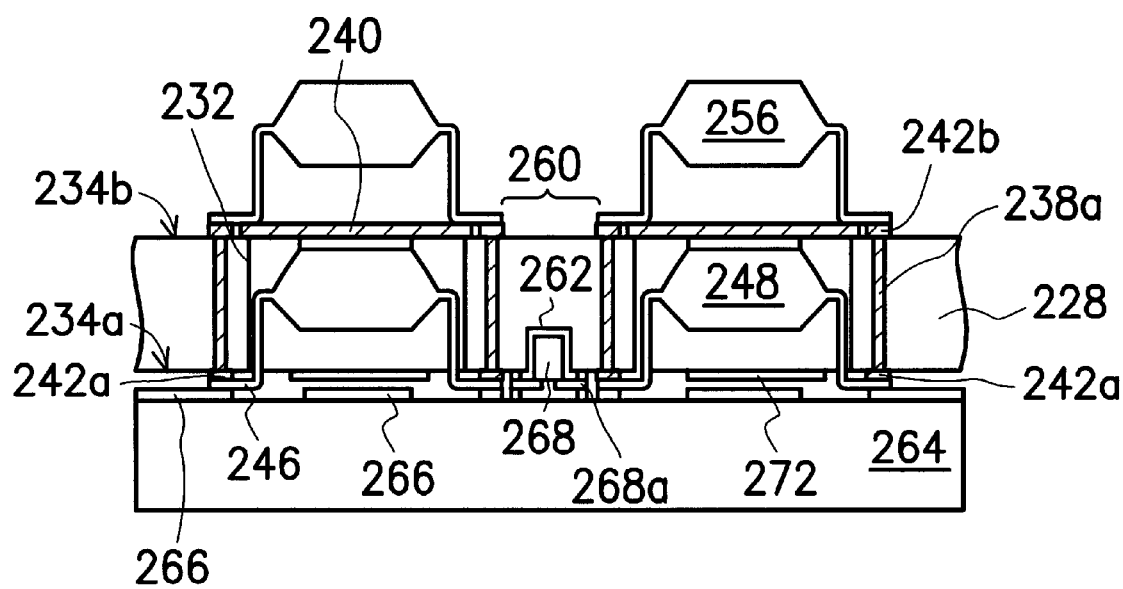
FIG. 10A is a schematic, cross-sectional view of a memory module in which the stacked integrated circuit structure is employed in accordance with another embodiment of the presented invention.
Figure 10B:
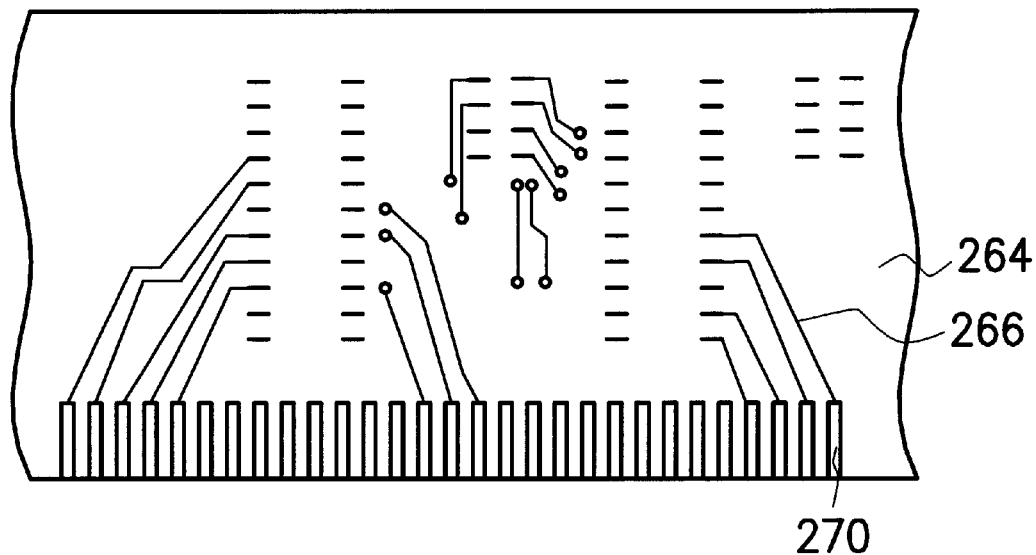
FIG. 10B is a top view of a module circuit board which matches the module illustrated in FIG. 10A.

Reference is made to FIGS. 10A and 10B. FIG. 10A illustrates a schematic, cross-sectional view of a memory module in which the stacked integrated circuit structure is employed in accordance with another embodiment of the present invention, and FIG. 10B is a top view of a module circuit board which matches the module illustrated in FIG. 10A. The differences between stacked integrated circuit structures shown in FIGS. 7 and 9A and the one shown here are as follows. (1) The recess 262 is fabricated at the same time as the holes 232. (2) The terminals 242a and the traces 272 located near the recess 262 are defined at the same time as the terminals 242a, 242b, and the copper film 240. (3) The electronic element 268 is secured in the recess 262 at the same time as the assembly of the integrated circuit 248, with the leads 268a of the electronic element 268 electrically connected to the terminals 242a located around the periphery of the recess 262. According to the embodiment shown in FIG. 10B, the module circuit board 264 includes the traces 266 and the golden fingers 270 located at the edge of the module circuit board 264. During assembly process, the substrate 228 together with the integrated circuits 248, 256, and the electronic element 268 are assembled with the first surface 234a facing to the module circuit board 264. By means of the SMT technique, electrical connections between the terminals 242a, the leads 246, 268a on the first surface 234a of the substrate 228 and the traces 266 on the module circuit board 264 are established. Thus, the main circuitry of the module according to the embodiment described here is all arranged on the substrate 228, which includes the memory and connections among the electronic elements. The module circuit board 264 is only employed to establish connections between the circuitry on the substrate 228 and the golden fingers 270, and hence, the outside world.

The two preferred embodiments described above are both applicable to the single in-line memory module (SIMM), the dual in-line memory module (DIMM), the rambus in-line memory module (RIMM), etc. Although the structure similar to the one shown in FIG. 7 is employed in the two preferred embodiments, the stacked integrated circuit structure shown in FIG. 8 can also be employed in the memory module. This can further increase the memory size. The stacked integrated circuit structure in accordance with the present invention is applicable to flash memory or SRAM, as well.

Based on the foregoing, the advantages of the present invention comprise:

1. In a stacked integrated circuit structure according to the present invention, a substrate is employed as a stacking medium between leads of integrated circuits. This can tightly secure the leads. Moreover, a technique similar to the SMT technique is made used to establish connections between the leads and the substrate. There no need for additional apparatus in mass production.

2. A stacked integrated circuit structure according to the present invention is applicable to a memory module, in which the memory size is increased but not the overall area. Hence, the densification of the assembly of the memory module is increased.

3. In a stacked integrated circuit structure according to the present invention, spacings between electronic elements, and recesses for receiving the electronic elements of a module for later assembly process can be considered and be reserved during the design period of the substrate. This makes the production and assembly of the memory module considerably easier.

4. In a stacked integrated circuit structure according to the present invention, circuitry and electronic elements of a memory module can be directly fabricated in the substrate used for stacking, and hence, the goal of manufacturing process integration is achieved.

While the present invention has been disclosed with reference to the preferred embodiments described above, it is not intended to limit the present invention in any way. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked integrated circuit structure, comprising:

a plurality of integrated circuits each at least having a main package body and a plurality of leads, wherein the leads have a plurality of inner leads and a plurality of outer leads, the main package bodies of the integrated circuits are stacked on each other;

a substrate located between the outer leads of every two adjacent integrated circuits, the substrate having a central space, a first surface, and a second surface, wherein each surface includes a plurality of terminals on the first surface and the second surface, the substrate includes a plurality of conductive through vias electrically connected to the corresponding terminals on the first surface and the second surface, the terminals are also located corresponding to the leads positions, the central space houses the main package body of one of the two integrated circuits, with the leads of the selected integrated circuit connected to the respective terminals on the first surface, and another adjacent integrated circuit with the leads connected to the respective terminals on the second surface.

2. The structure of claim 1, wherein the main package body further comprises:

a die attached on a die pad, wherein the die has an active surface and a bottom surface, the bottom surface is adhered onto the die pad;

a plurality of bonding pads on the die;

a plurality of wires connected to the bonding pads of the die at a peripheral region of the active surface of the die and the inner leads; and an insulating material encapsulating the die, the die pad, the wires and the inner leads.

3. The structure of claim 1, wherein a material for the substrate is selected from a group consisting of FR-4, FR-5, and BT.

4. The structure of claim 1, wherein connections between the leads and the terminals are established by means of a solder material.

5. The structure of claim 1, wherein the second surface includes a copper film secured on the hole of the substrate, and the copper film is connected to the main package body of the integrated circuit inside the hole.

6. A stacked integrated circuit structure, comprising:

a plurality of integrated circuits each at least having a main package body and a plurality of outer leads located along an edge of the main package body, wherein the main package bodies of the integrated circuits are stacked on each other; and a plurality of substrates located between the outer leads of every two adjacent integrated circuits, and located at a lateral edge of the main package body of a first of two adjacent integrated circuits, each of the substrates having a first surface, and a second surface, wherein each of the surfaces includes a plurality of terminals, each of the substrates includes a plurality of conductive through vias electrically connected to the corresponding terminals on the first surface and the second surface, the terminals are also located corresponding to the outer leads positions, and the outer leads of the first integrated circuit between the substrates are connected to the respective terminals on the first surfaces, with a second adjacent integrated circuit mounted on the second surfaces of the substrates with the outer leads connected to the respective terminals on the second surfaces.

7. The structure of claim 6, wherein the second surfaces have a copper film secured between the substrates, and the copper film is connected to the main package body of the integrated circuit between the substrates.

8. The structure of claim 6, wherein a material for the substrates is selected from a group consisting of FR-4, FR-5, and BT.

9. The structure of claim 6, wherein connections between the leads and the terminals are established by means of a solder material.

10. A stacked memory module structure, comprising:

a substrate having a plurality of first holes, a first surface, and a second surface, wherein each of the surfaces includes a plurality of first terminals, and the substrate includes a plurality of first through vias electrically connected to the corresponding first terminals on the first and the second surfaces, the substrate also including a plurality of recesses located on the first surface between the first holes;

a plurality of first integrated circuits each at least having a main package body and a plurality of outer leads located along an edge of the main package body, the main package body of each first integrated circuit being mounted inside the first hole, with the outer leads of each first integrated circuit electrically connected to the respective first terminals on the first surface locted around a periphery of the correspondind first hole;

a plurality of second integrated circuits, each at least having a main package body and a plurality of outer leads located along an edge of the main package body, wherein each of the second integrated circuits aligned on the second surface corresponds to a position of the first integrated circuit, the main package bodies of the second integrated circuits are stacked on the respective main package bodies of the first integrated circuits, with the outer leads of each of the second integrated circuits electrically connected to the respective first terminals on the second surface located around the periphery of the corresponding first hole; and a module circuit board having at least a plurality of traces, a plurality of electronic elements, and a plurality of golden fingers on its surface, wherein the electronic elements are electrically connected to the traces, and the golden fingers which are located along an edge of the module circuit board are electrically connected to the traces;

wherein the substrate, together with the first integrated circuits and the second integrated circuits, are mounted on the module circuit board by use of the first surface, so that the first terminals on the first surface are electrically connected to the traces, and the electronic elements are received inside the recesses.

11. The structure of claim 10, further comprising:

a plurality of third integrated circuits stacked on the second integrated circuits, each of the third integrated circuits at least having a main package body and a plurality of leads located around an edge of the main body; and at least a stacking substrate located between the leads of every two stacked integrated circuits, that is, between the second integrated circuits and the third integrated circuits, and between the third integrated circuits themselves, the stacked substrate including a plurality of second holes, a third surface, and a fourth surface, wherein each of the surfaces has a plurality of second terminals, and the stacking substrate includes a plurality of through vias electrically connected to the corresponding second terminals on the third surface and the fourth surface, the second terminals are also located corresponding to the leads positions, each of the second holes houses the main package body of one of two integrated circuits stacked on each other, with the leads thereof electrically connected to the respective terminals on the fourth surface, and another stacked integrated circuit mounted on the third surface with the leads electrically connected to the respective second terminals on the third surface.

12. The structure of claim 10, wherein the second surface includes copper films secured on the first holes of the substrate, and the copper films are connected to the main package bodies of the integrated circuits inside the first holes.

13. The structure of claim 11, wherein the third surface includes copper films secured on the second holes of the stacking substrate, and the copper films are connected to the main package bodies of the integrated circuits inside the second holes.

14. A stacked memory module structure, comprising:

a substrate having a plurality of first hole, a first surface, and a second surface, wherein each of the surfaces includes a plurality of first terminals, and the substrate includes a plurality of first through vias electrically connected to the corresponding first terminals on the first and the second surface, the substrate also including a plurality of recesses located on the first surface between the first holes and a plurality of first traces electrically connected to the first terminals;

a plurality of first integrated circuits each at least having a main package body and a plurality of outer leads located along an edge of the main package body, and the main package body of each of the first integrated circuits mounted inside the first hole, with the outer leads of each of the first integrated circuits electrically connected to the respective first terminals of the first surface located around a periphery of the corresponding first hole;

a plurality of second integrated circuits each at least having a main package body and a plurality of outer leads located along an edge of the main package body, wherein each of the second integrated circuits aligned on the second surface corresponds to a position of the first integrated circuit, the main package bodies of the second integrated circuits are stacked on the respective main package bodies of the first integrated circuits, with the outer leads of each of the second integrated circuits electrically connected to the respective first terminals on the second surface located around the periphery of the corresponding first hole;

a plurality of electronic elements, each received inside the respective recesses and electrically connected to the first terminals; and a module circuit board having at least a plurality of second traces and a plurality of golden fingers on its surface, the golden fingers which located along an edge of the module circuit board electrically connected to the second traces;

wherein the substrate, together with the first integrated circuits, the second integrated circuits, and the electronic elements, is mounted on the module circuit board by use of the first surface, so that the first terminals on the first surface are electrically connected to the second traces.

15. The structure of claim 14 further comprising:

a plurality of third integrated circuits stacked on the second integrated circuits, each of the third integrated circuits at least having a main package body and a plurality of leads located around an edge of the main body; and at least a stacking substrate located between the leads of every two of the stacked integrated circuits, that is, between the second integrated circuits and the third integrated circuits, and between the third integrated circuits themselves, the stacking substrate including a plurality of second holes, a third surface, and a fourth surface, wherein each of the surfaces has a plurality of second terminals, and the stacking substrate also includes a plurality of through vias electrically connected to the corresponding second terminals on the third surface and the fourth surface, the second terminals also located corresponding to the leads positions, the second holes housing the main package body of one of the two integrated circuits stacked on each other, with each lead of the selected integrated circuit electrically connected to a respective terminal on the fourth surface, and another stacked integrated circuit is mounted on the third surface with each lead electrically connected to a respective second terminal of the third surface.

16. The structure of claim 14, wherein the second surface includes copper films secured on the first holes of the substrate, and the copper films are connected to the main package bodies of the integrated circuits inside the first holes.

17. The structure of claim 15, wherein the third surface includes copper films secured on the second holes of the stacking substrate, and the copper films are connected to the main package bodies of the integrated circuits inside the second holes.

* * * * *